United States Patent [19]

Amazawa et al.

[11] Patent Number: 4,682,045
[45] Date of Patent: Jul. 21, 1987

[54] NOISE ELIMINATING SIGNAL COMPENSATION CIRCUIT

[75] Inventors: Kiyoshi Amazawa; Akira Mori, both of Tokyo, Japan

[73] Assignee: Clarion Co., Ltd., Tokyo, Japan

[21] Appl. No.: 826,828

[22] Filed: Feb. 6, 1986

[30] Foreign Application Priority Data

Feb. 12, 1985 [JP] Japan .................................. 60-25440

[51] Int. Cl.[4] .............................................. H04H 5/00
[52] U.S. Cl. .................................. 307/125; 307/106; 455/222; 455/223; 328/165
[58] Field of Search ................ 307/125, 106; 455/213, 455/308, 296, 297, 130, 135, 136, 137, 138, 139, 140, 285, 222, 223; 328/165; 340/292

[56] References Cited

U.S. PATENT DOCUMENTS

| | | | |
|---|---|---|---|
| 4,152,657 | 5/1979 | Robers et al. | 455/296 X |
| 4,178,552 | 12/1979 | Amazawa et al. | 455/223 X |
| 4,246,441 | 1/1981 | Sugai et al. | 455/223 X |
| 4,266,296 | 5/1981 | Ishigaki | 455/296 X |
| 4,268,793 | 5/1981 | Amazawa et al. | 455/222 X |
| 4,304,004 | 12/1981 | Neyen | 455/135 X |
| 4,305,042 | 12/1981 | Tanaka et al. | 455/223 X |
| 4,311,963 | 1/1982 | Watanabe et al. | 328/165 X |
| 4,314,377 | 2/1982 | Kondo et al. | 455/223 |
| 4,419,541 | 12/1983 | Kishi et al. | 455/223 X |
| 4,517,518 | 5/1985 | Ishigaki | 455/223 X |
| 4,531,095 | 7/1985 | Ishigaki et al. | 455/223 X |
| 4,541,101 | 9/1985 | Potage et al. | 455/222 X |
| 4,555,669 | 11/1985 | Namiki | 328/165 X |
| 4,574,390 | 3/1986 | Hirohashi et al. | 455/223 X |

Primary Examiner—William M. Shoop, Jr.
Assistant Examiner—Shik Luen Paul Ip
Attorney, Agent, or Firm—Flynn, Thiel, Boutell & Tanis

[57] ABSTRACT

A noise eliminating signal compensation circuit in an audio device such as a car radio is configured to produce a compensation signal having the same frequency and level as those of an entered signal for signal compensation during noise removal, so as never to degrade its signal compensation capacity during noise removal when the switching time for noise removal is relatively long with respect to the wavelength of the entered signal.

5 Claims, 18 Drawing Figures

NOISE ELIMINATING SIGNAL COMPENSATION CIRCUIT

FIELD OF THE INVENTION

This invention relates to a noise eliminating signal compensation circuit used in an audio device such as a car radio to effectively compensate an entered signal, particularly when the switching time for noise removal from the entered signal is relatively long with respect to the wavelength of the entered signal.

BACKGROUND OF THE INVENTION

A pulsive noise such as ignition noise inevitable in an audio device such as a car radio causes wave degradation or distortion in an entered audio signal and results in reproduced sound which offends human ears.

Figure 6:
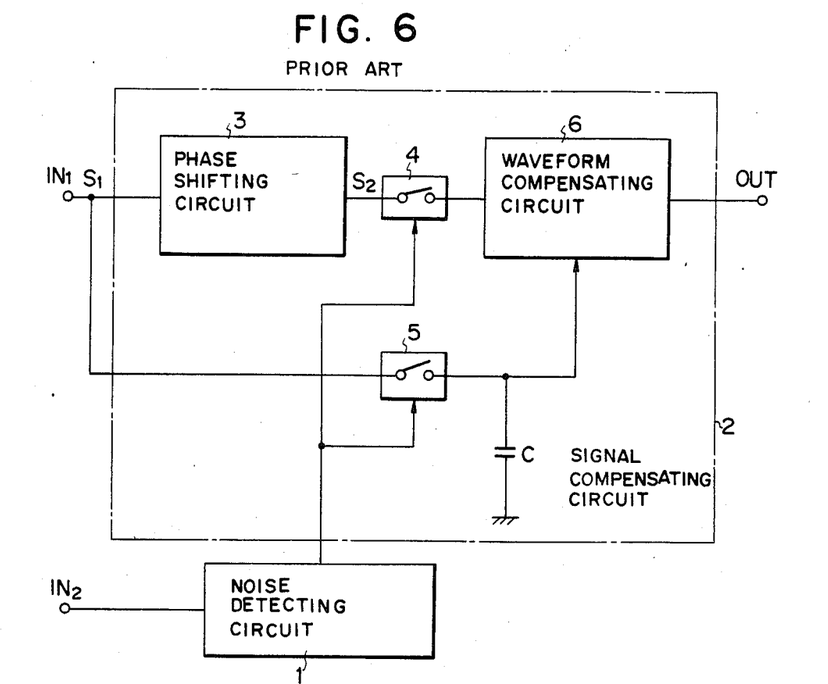
FIGS. 6 and 7 are a block diagram and a waveform diagram of a prior art circuit.

A prior art proposal of preventing this is the use of a signal compensation circuit as shown in FIG. 6, wherein reference numeral IN1 and OUT denote input and output terminals for inputting and outputting audio signals, IN2 designates a detection input terminal for receiving pulsive noises, 1 refers to a pulsive noise detecting circuit, and 2 to a signal compensation circuit including a phase shifting circuit 3, switches 4 and 5, a waveform compensation circuit 6 and a capacitor C.

Figure 7:
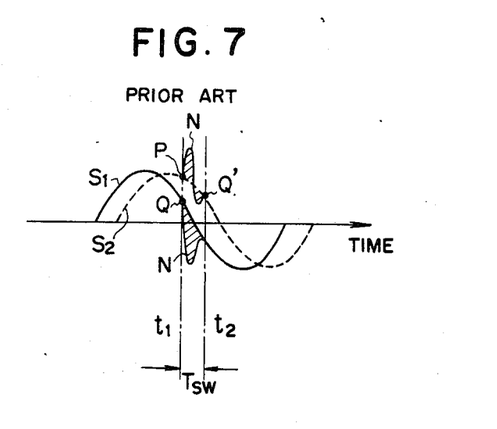

An input signal S1 entered in the terminal IN1 is phase shifted into a signal S2 by the phase shifter 3 as shown in FIG. 7, thereafter processed by the waveform compensation circuit 6, and outputted from the terminal OUT.

When a pulsive noise is detected by the pulsive noise detecting circuit 1 via the terminal IN2, the detector 1 turns off the switches 4 and 5 for a predetermined duration TSW so as to block the input signal transmission to the waveform compensating circuit 6.

Referring to FIG. 7, if a pulsive noise N is produced in the period between times t1 and t2, the pulsive noise N is mixed up with the input signals S1 and S2 and distorts their waveforms.

Therefore, by detecting the pulsive noise N by the detector 1 and setting the switching time (off time) TSW equal to the duration between t1 and t2, the input signal transmission is stopped completely while the pulsive noise exists.

If the delay time of the phase shifter 3 for the input signal S1 is equal to the duration TSW, the level Q' of the signal S2 at the time t2 is known from the level Q of the signal S1 at the switching starting time t1, so as to establish a so-called "pre-holding".

Therefore, if the waveform compensation circuit 6 is activated to shape the waveform of the signal S2 in a continuous form between the levels P and Q' thereof, referring to the levels P and Q of the signals S1 and S2 at the time t1, the waveform of the phase-shifted signal S2 is compensated regardless that transmission of the signal S2 is stopped during the switching time TSW.

The prior art signal compensation circuit certainly operates effectively when the switching time TSW is relatively short i.e. one fourth or less, for example, of the wavelength of the received signal. However, if the switching time TSW is longer, the compensation effectiveness largely decreases. Therefore, the prior art signal compensation circuit cannot be used in a device for reception of high frequency signals.

OBJECT OF THE INVENTION

It is therefore an object of the invention to provide a noise eliminating signal compensation circuit which is never degraded in the signal compensation capability even when the switching time for noise removal from the received signal is relatively long with respect to the wavelength of the input signal.

SUMMARY OF THE INVENTION

According to the present invention, there is provided a noise eliminating signal compensation circuit comprising: switch means turned on or off for passing or blocking a received signal;

noise detecting means for detecting a noise mixed in said received signal and turning off said switch means;

compensation signal generating means for generating a compensation signal during the off period of said switch means;

said compensation signal generator including a signal generating means activated by said input signal applied thereto via said switch means and inactivated upon detection of said noise, and including level control means and a holding means for said compensation signal; and said signal generating means including a circuit for generating a signal having the same frequency as that of said received signal, said level control means including a circuit for adjusting said same frequency signal to the same level as that of said received signal and entering it in said holding means as said compensation signal.

The inventive arrangement can produce a signal having the same frequency and level as those of an input signal to use it as a compensation signal upon detection of a noise, thus effectively performing signal compensation of the input signal even when the switching time is relatively long with respect to the wavelength of the input signal.

The invention will be understood better from the description given below, referring to an embodiment illustrated in the drawings.

BRIEF DESCRIPTION OF THE DRAWINGS

FIGS. 2(a), 2(b), 3(a) through 3(d), 4(a) through 4(d) and 5(a) through 5(g) show waveforms of signals in different positions and times;

DETAILED DESCRIPTION

Figure 1:
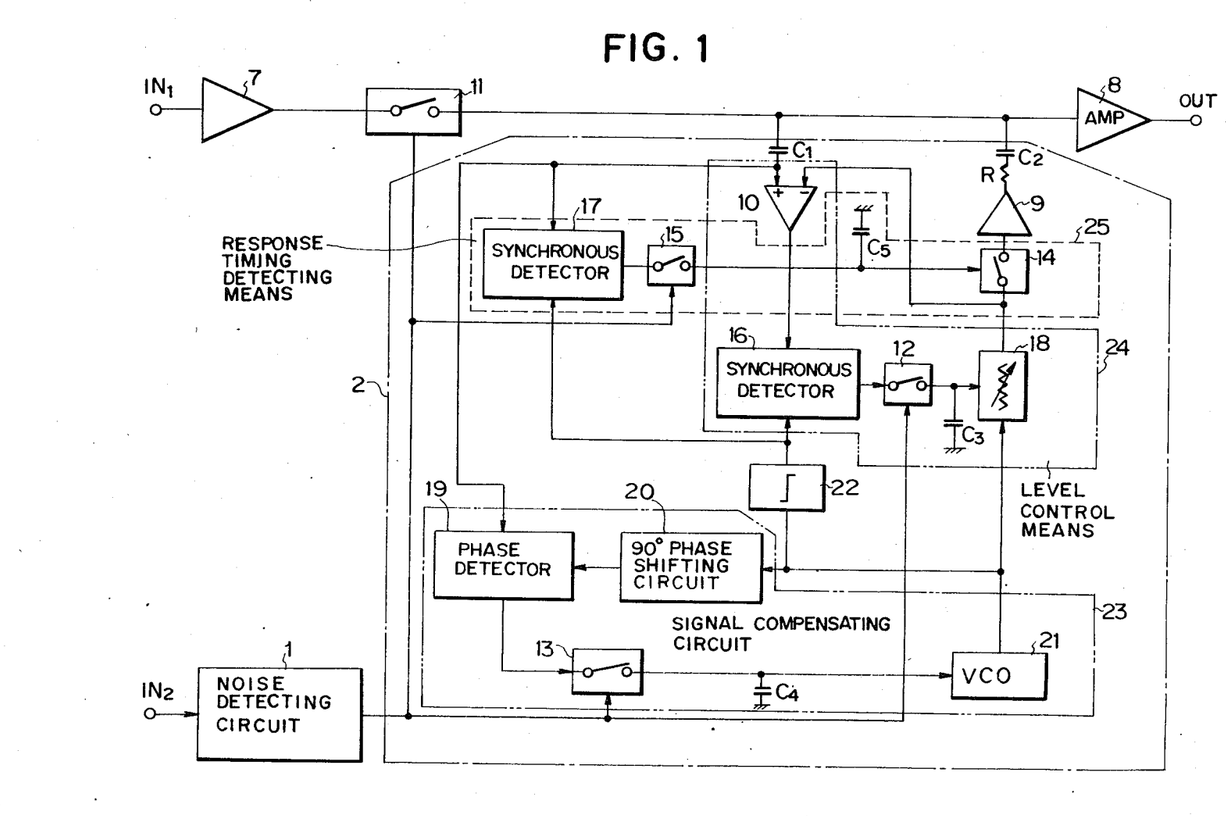
FIG. 1 is a block circuit diagram of a noise eliminating signal compensation circuit embodying the invention.

FIG. 1 is a block diagram of a noise eliminating signal compensation circuit embodying the invention in which some reference numerals used in FIG. 6 denote the same or equivalent members. Reference numeral 7 denotes a low output impedance buffer amplifier, 8 refers to a high input impedance buffer amplifier, 9 to a buffer amplifier (voltage gain 1), 10 to a differential amplifier, 11 through 15 to switches, 17 to a synchronous detector, 18 to a voltage control attenuator, 19 to a phase detector, 20 to a 90° phase shifter, 21 to a VCO (voltage control oscillator), 22 to a rectangular wave converter, C1 to a low band cutoff capacitor, C2 to a level holding capacitor, C3, C4 and C5 to integral and level holding capacitors, and R to a signal absorbing resistor.

Reference numeral 23 denotes a signal generator comprising a PLL circuit, for example, and including the switch 13, phase detector 19, 90° phase shifter 20, VCO 21 and integral and level holding capacitor C4 so as to generate a signal having the same frequency as that of an input signal entered in the terminal IN1.

Reference numeral 24 designates a level controller including the differential amplifier 10, switch 12, synchronous detector 16, voltage control attentuator 18 and integral and level holding capacitor C3 and activated to equalize the level of a signal received from the signal generator 23 to the level of the input signal.

Reference numeral 25 designates a response timing detector including the switches 14–15, synchronous detector 17, and integral and level holding capacitor C5 and responsive to the input signal to detect the response timing of the signal generator 23 and level controller 24 and supply the high input impedance amplifier 8 with a compensation signal having the same frequency and level as those of the input signal via the buffer amplifier 9, resistor R and level holding capacitor C2.

An audio signal including a pulsive noise is entered in the buffer amplifier 7 via the terminal IN1, thereafter applied to the buffer amplifier 8, and outputted from the terminal OUT.

The noise detector 1, when it detects a pulsive noise via the terminal IN2, turns off the switches 11, 12, 13 and 15 during the time TSW to block the audio signal from being applied from the buffer amplifier 7 to the buffer amplifier 8.

While no audio signal is supplied to the buffer amplifier 8, a waveform compensated input signal must be supplied thereto.

Figure 2A:
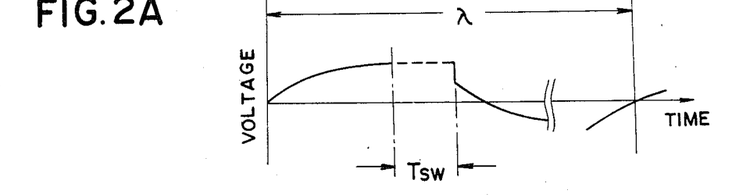
Figure 2B:
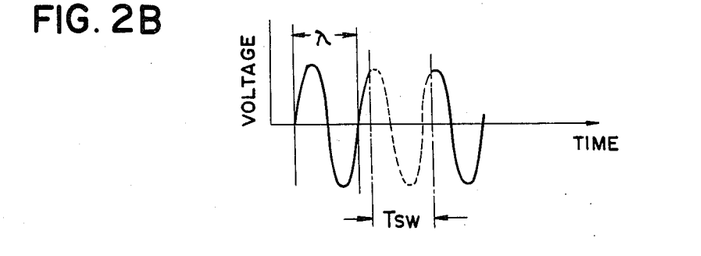

If the switching time TSW is relatively short with respect to the wavelength of the audio signal, a pre-holding using the level holding capacitor C2 as shown in FIG. 2(a) provides an effective compensation. This method, however, is not effective if the switching time is relatively long with respect to the wavelength, because the compensation using the capacitor C2 permits a great increase of the waveform distortion.

The inventive arrangement enables an effective waveform compensation in this situation.

The basic concept of the invention is to generate a compensation signal having the same frequency and level as those of the input signal, using the signal generator 23 and level controller 24. Beside this, if the response timing detector 25 is activated in combination with the aforegoing signal generator 23 and level controller 24, a more perfect waveform compensation is obtained.

Hereinbelow, the operation of the inventive arrangement is explained, dividing it into some parts.

(OPERATION OF SIGNAL GENERATOR 23)

The PLL circuit forming the signal generator 23 generates a signal having the same frequency as that of an audio signal entered through the terminal IN1.

Figure 3A:
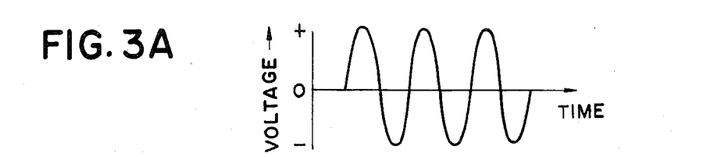

An audio signal which is entered while the switches 11 through 15 are turned on is applied to the phase detector 19 via the low band cutoff capacitor C1. FIG. 3(a) shows the waveform of the input signal to the phase detector 19. The phase detector 19 sums up this input signal and another input signal entered from the 90° phase shifter 20, and produces level signals corresponding to the respective input signals. The signal from the 90° phase shifter 20 may be a pulsive signal represented by binary digit "1" or "0", depending on whether the phase difference of the input signal with respect to the frequency of the audio signal is equal to, larger than or smaller than $\pi/4$.

Figure 3B:
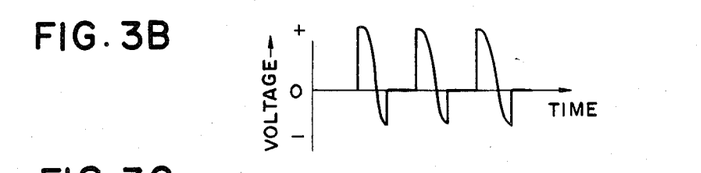

FIG. 3(b) shows the waveform of an output from the phase detector 19 responsive to an input signal with a phase difference larger than $\pi/4$. The output is integrated (smoothed) by the integral and level holding capacitor C4, thereafter converted into a plus d.c. voltage, and applied to the VCO 21. The VCO 21 generates a sine wave which is phase shifted by application of the plus d.c. voltage.

Figure 3C:
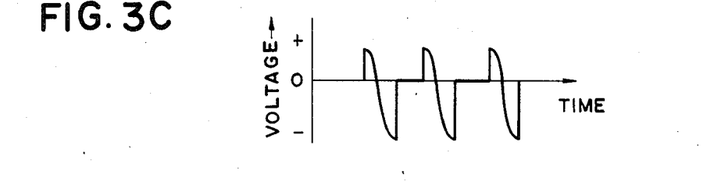
Figure 3D:
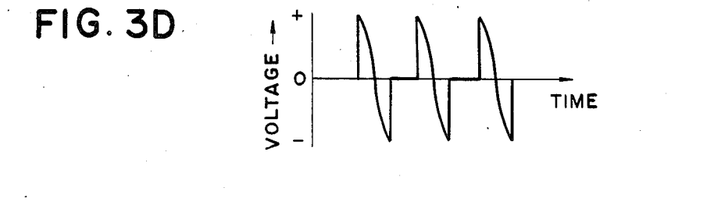

FIG. 3(c) shows the waveform of an output from the phase detector 19 responsive to an input signal having a phase difference smaller than $\pi/4$. The output is integrated by the capacitor C4, converted into a minus d.c. voltage, and applied to the VCO 21. A sine wave output of the VCO 21 is phase shifted by application of the minus d.c. voltage.

FIG. 3 (d) shows the waveform of an output from the phase detector 19 responsive to an input signal having a phase difference just equal to $\pi/4$. The output is integrated by the capacitor C4 into "0" and applied to the VCO 21. The phase of a sine wave output of the VCO 21 is locked by application of "0" voltage. The locked phase is equal to that of the audio signal.

Therefore, the PLL circuit 23 always produces a signal having the same frequency as that of the audio signal.

(OPERATION OF LEVEL CONTROLLER 24)

The level controller 24 receives the output signal from the signal generator 23 having the same frequency as that of the audio signal, and maintains the level of the signal equal to that of an audio signal outputted from the buffer amplifier 7.

The output signal from the VCO 21 is applied to the signal absorbing resistor via the voltage control attenuator 18, switch 14 and buffer amplifier 9, and also applied to the input of the buffer amplifier 8 via the level holding capacitor C2.

Figure 4A:
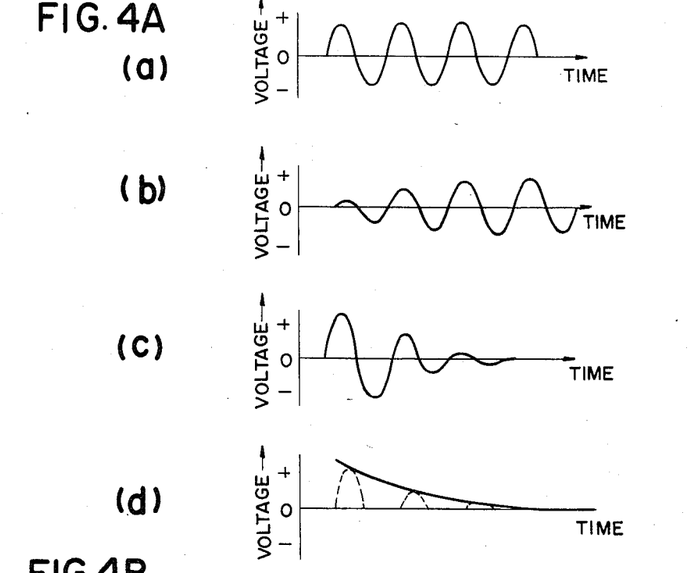
Figure 4B:
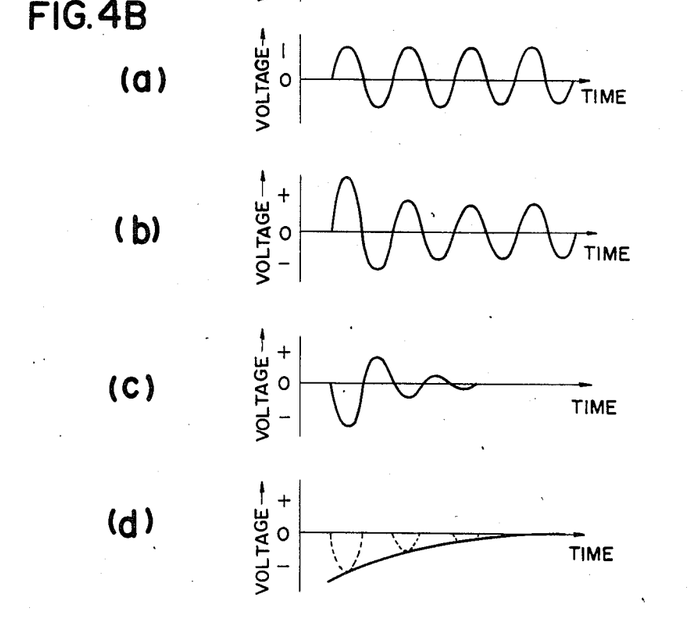

An output from the voltage control attenuator 18 is applied to the minus terminal of the differential amplifier 10, whereas the plus terminal of the differential amplifier 10 is supplied with an audio signal having the waveform shown in FIG. 4A(a) via the low band cutoff capacitor C1, so that the differential amplifier 10 produces a level signal corresponding to the difference between the two entered signals in magnitude. FIG. 4 shows at (A) waveforms obtained when the output of the voltage control attenuator 18 is small, and at (B) waveforms obtained when the output is large.

In the case (A), the voltage control attenuator 18 applies a signal with the waveform shown at (b) to the minus terminal of the differential amplifier 10 which responsively produces a signal with the waveform shown at (c). The signal (c) is equal to the signal (a) in phase, and the synchronous detector 16 multiplies the signal (c) by a pulse signal converted from the VCO output signal by the rectangular wave converter 22. The resultant signal is shown by a dotted line at (d), and this is further integrated by the integral and level holding capacitor C3 into a plus d.c. voltage shown by a solid line at (d). In receipt of the plus d.c. voltage via the switch 12, the voltage control attenuator 18 is controlled to increase the output level, and feedback is continued until the difference between the two input signals to the differential amplifier 10 becomes zero.

In the case (B), the minus terminal of the differential amplifier 10 receives from the attenuator 18 a signal having the waveform shown at (b) and having a larger output level than the signal (a). The differential amplifier 10 responsively produces a signal with the waveform shown at (c) opposite to the signal (a) in phase. The signal (c) is processed in the same fashion as (A), and converted into a signal shown by a dotted line at (d). This signal is further integrated by the capacitor C3 into a minus d.c. voltage shown by a solid line at (d). On receipt of the minus d.c. voltage, the attenuator 18 is controlled to attenuate the output level, and feedback is continued until the difference between the two input signals of the differential amplifier 10 becomes zero.

Therefore, in either case (A) or (B), the output of the voltage control attenuator 18 is adjusted to have the same level as that of the audio signal entered in the plus terminal of the differential amplifier 10.

The level controller 24 always produces a signal having the same level as that of the audio signal, accordingly.

Basically, an output signal from the level controller 24, when applied the buffer amplifier 8, can compensate the waveform of the audio signal.

In order to perform an effective signal compensation regardless of a relatively short switching time TSW with respect to the wavelength of the input signal, the value of the capacitor C1 for entering an input audio signal in the signal generator 23 is selected to simply transmit high frequency signals but block low band frequency signals. Removal of low frequency signals leads to a speedup of the circuit operation. Nevertheless, immediate or instantaneous response cannot be expected in the signal generator 23 and level controller 24. Therefore, the output signal from the voltage control attenuator 18 which is part of the level controller 24 is not constant before the signal generator 23 and level controller 24 respond, and cannot be used as a compensation signal.

Before the signal generator 23 and level controller 24 are actually activated by the audio signal, the switch 14 connected to the attenuator 18 must once be turned off and thereafter turned on when the signal compensating operation follows, so as to perform a perfect signal compensation.

The response timing detector 25 is just the means for this purpose.

(OPERATION OF RESPONSE TIMING DETECTOR 25)

The response timing detector 25, on detection of the response timing of the signal generator 23 and level controller 24 in response to application of the audio signal, supplies the buffer amplifier 9 with the signal which has the same frequency and level as those of the audio signal and which serves as a compensation signal.

By multiplying the audio signal entered in the synchronous detector 17 via the capacitor C1 by a pulse signal entered in the detector 17 via the rectangular wave converter 22, the synchronous detector 17 can produce a d.c. voltage proportional to the level of the audio signal if the entered two signals are equal in frequency and phase. Therefore, when the d.c. voltage is obtained, the PLL circuit which is part of the signal generator 23 is stabilized (locked).

However, since the level controller 24 performs a level control after the PLL circuit is once stabilized, the synchronous detector 17 can produce a d.c. voltage upon completion of the level control operation, regardless of the value of the integral and level holding capacitor C5.

At the stage when the d.c. voltage is obtained, it is deemed that the compensation signal has already been controlled to be equal to the audio signal in frequency and level. Therefore, by using the d.c. voltage to turn on the switch 14, the compensation signal is transmitted from the voltage control attenuator 18 via the buffer amplifier 9 to the buffer amplifier 8.

In this fashion, the response timing detector 25 permits the compensation signal to enter in the buffer amplifier 8 only after detecting (acknowledging) that the compensation signal is in the proper form.

The signal compensating operation of the circuit is performed accordingly.

The signal compensating operation is hereinbelow explained, relative to presence and absence of pulsive noises.

When no pulsive noise is detected, the switches 11, 12, 13 and 15 are turned on, and the switch 14 may be on or off. If the output impedance of the switch 11 is significantly small with respect to the signal absorbing resistor R, the resistor R can absorb both signals for the buffer amplifier 8 regardless of what signal is outputted from the buffer amplifier 9. Therefore, the buffer amplifier 8 receives the audio signal through the switch 11 and sends it out from the terminal OUT, under no influence by other signals.

In this stage, the signal generator 23 and level controller 24 follow the audio signal.

When a pulsive noise is detected, the noise detecting circuit 1 turns the switches 11, 12, 13 and 15. If the switch 14 is on, the buffer amplifier 9 produces a compensation signal having the same frequency and level as those of the audio signal, and applies it to the buffer amplifier 8 via the resistor R and capacitor C2. At that time, if the input impedance of the buffer amplifier 8 is significantly large with respect to the resistor R, the output level of the buffer amplifier 9 equals the input level of the buffer amplifier 8.

Pulsive noise eliminating and signal compensating operation of the invention circuit is hereinbelow explained, referring to FIG. 5.

An entered audio signal having the waveform shown at (a) includes a pulsive noise during the time between t1 and t2. The output from the VCO 21 has the waveform shown at (b). This output is phase shifted by $\pi/2$ in the 90° phase shifter 20 and transformed into a pulsive signal. The pulsive signal is multiplied by the audio signal in the phase detector 19 to produce a signal having the waveform shown at (c). The signal (c) is integrated by the capacitor C4 into a signal having the waveform shown at (d). During this process, at the time t0 the PLL circuit is locked at the audio signal, the level controller 24 finishes its level control operation, and the synchronous detector 17 produces a d.c. voltage shown at (e). In receipt of the d.c. voltage, the switch 14 is turned on to enter a compensation signal shown at (f) in the buffer amplifier 9.

Therefore, the resistor R and capacitor C2 receive at both ends thereof the same level signals which make no potential difference.

Figure 5A:
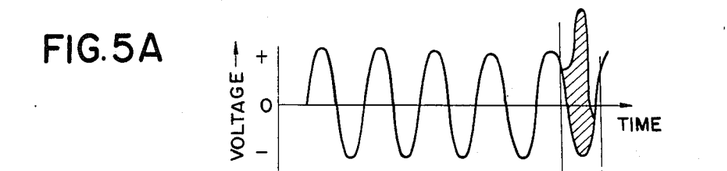
Figure 5B:
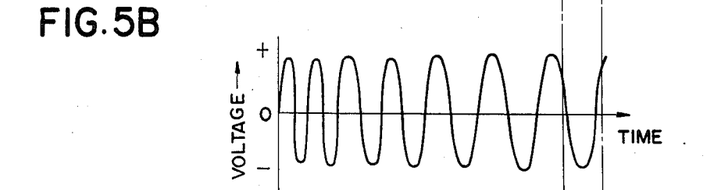
Figure 5C:
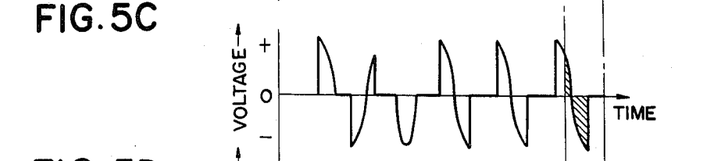
Figure 5D:
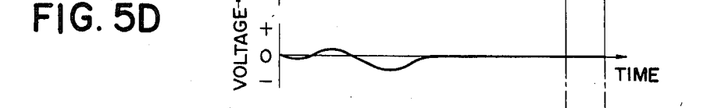
Figures 5E, 5F:
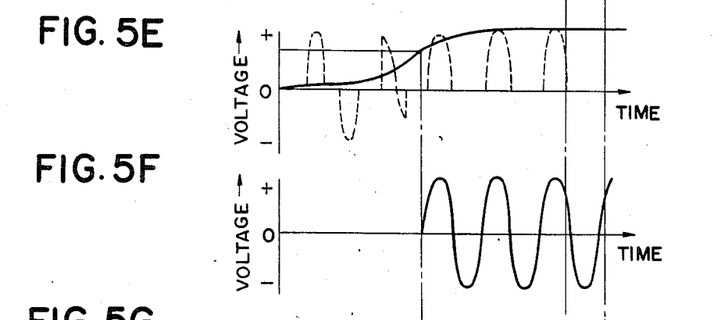
Figure 5G:
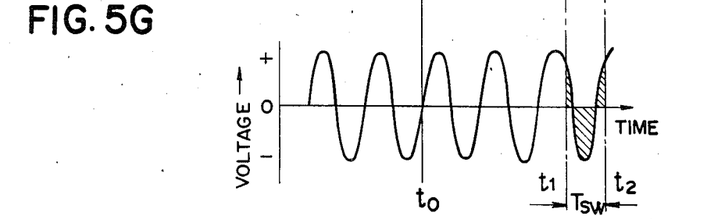

During the time between t1 and t2, the pulsive noise detector 1 detects the pulsive noise N, and the switches 11, 12, 13 and 15 are turned off during the time TSW to remove the pulsive noise. Throughout the time, the capacitors C3, C4 and C5 maintain the d.c. potential just before the time t1, and a compensation signal shown at (g) is entered in the buffer amplifier 8 via the resistor R and capacitor C2 during the switching time TSW. In the waveforms at (c) and (g), hatched portions are compensated.

Since a compensation signal shown at (f) is re-entered in the signal generator 23 and level controller 24 via the capacitor C1 and used as a reference signal source, if the switches 12, 13 and 15 are not turned off, there is a possibility that the signal generator 23 and level controller 24 are operatively changed by some external factors.

Therefore, it is indispensable that the capacitors C3, C4 and C5 are engaged in level maintenance while the switches 12, 13 and 15 are off.

When the audio signal has a low frequency which is blocked by the capacitor C1, the output d.c. voltage of the synchronous detector 17 becomes zero, and the switch 14 is turned off.

At that time, when the switch 11 is turned off upon detection of a pulsive noise, the capacitor C2 maintains the potential just before the switch 11 is turned off. If the resistor R has a relatively small value with respect to the impedance of the capacitor C2 in the low frequency, any influence by the resistor R may be disregarded.

For a better understanding only, the aforegoing description assumes that the audio signal (input signal) is a single sine wave. However, the audio signal actually comprises a plurality of sine waves combined together, and the levels of the respective frequency components are always changed. In the most usual case, the audio signal is a combination or mixture of the respective frequency components oscillating at several cycles. If the duration of the oscillation is short, the effect of the signal compensation is not prominent regardless that the switching time TSW is relatively long with respect to the wavelength of the audio signal.

Presumably, this is because the frequency spectrum of the audio signal is so wide that the signal distortion on noise removal is in the range disregarded by human ears.

If the oscillating time is long, however, the frequency spectrum is so narrow as to approach a sine wave, and the signal distortion during noise removal is readily heard by human ears. This is one of the cases where the inventive circuit can demonstrate its effective signal compensating ability.

As described, since the inventive circuit produces a compensation signal having the same frequency and level as those of a received signal, the input signal is effectively compensated also when the switching time during noise removal is relatively long with respect to the wavelength of the input signal.

Therefore, the effective range of the signal compensation is enlarged to input signals having high frequencies.

The inventive circuit most effectively improves a single sine wave such as a piano sound or time reporting chime sound whose signal distortion upon noise removal is serious to human ears. Additionally, the circuit is not limited to the use in reception by a radio receiver, buy may be effectively used in FM recording by a VTR.

The embodiments of the invention in which an exclusive property or privilege is claimed are defined as follows:

1. A noise eliminating signal compensation circuit, comprising:
   input terminal means and output terminal means;
   switch means having an input coupled to said input terminal means and adapted to be turned on and off for respectively passing and blocking an input signal present at said input terminal means, said switch means having an output which is coupled to said output terminal means;
   noise detecting means coupled to said input terminal means for detecting a noise component intermittently present at said input terminal means and for respectively turning said switch means off and on in response to the presence and absence of said noise component; and
   signal compensation circuit means having an input coupled through a coupling capacitor to said output of said switch means for generating a compensation signal in response to said input signal, wherein said signal compensation circuit means includes signal generating means responsive to said input signal when said switch means is turned on for generating a frequency signal having a frequency equal to that of said input signal, includes level control means responsive to said input signal and said frequency signal for adjusting a level of said frequency signal to a level substantially equal to that of said input signal, said adjusted signal being said compensation signal, and includes response timing detecting means for detecting a response timing of said signal generating means and level control means relative to said input signal and for supplying said compensation signal from said level control means to holding means upon detection of the response timing, said holding means facilitating application of said compensation signal to said output terminal means when said switch means is turned off;
   wherein said coupling capacitor connected between said switch means and said signal compensation circuit means passes only high frequency signal components, and wherein said response timing detecting means includes a first switch which is connected between said level control means and said holding means and which is turned on by said response timing detecting means upon detection of the response timing.

2. The circuit of claim 1, wherein said signal generating means includes a voltage controlled oscillator having an input and an output, a phase shifting circuit having an input connected to said output of said voltage controlled oscillator and having an output, a phase detector circuit having an output and having two inputs which are respectively connected to said output of said phase shifting circuit and an end of said coupling capacitor remote from said switch means, an electronic second switch which is connected between said output of said phase detector circuit and said input of said voltage controlled oscillator and which is turned on and off by said noise detecting means in synchronism with said switch means, and a level holding capacitor connected between ground and said input of said voltage controlled oscillator, wherein a signal produced by said voltage controlled oscillator at said output thereof is said frequency signal.

3. The circuit according to claim 2, wherein said level control means includes a rectangular wave converter having an output and having an input connected to said output of said voltage controlled oscillator, a voltage controlled attenuator having a signal input connected to said output of said voltage controlled oscillator, having a control input, and having an output, a differential amplifier having an output and having two inputs respectively connected to said output of said voltage controlled attenuator and an end of said coupling capacitor remote from said switch means, a first synchronous detector circuit having an output and having two inputs respectively connectedd to said output of said differential amplifier and said output of said rectangular wave converter, an electronic third switch which is connected between said output of said first synchronous detector circuit and said control input of said voltage controlled attenuator and which is turned on and off by said noise detecting means in synchronism with said switch means, and a capacitor connected between ground and said control input of said voltage controlled attenuator, wherein said voltage controlled attenuator produces at said output thereof said compensation signal.

4. The circuit of claim 3, wherein said response timing detecting means includes a second synchronous detector circuit having an output and having two inputs respectively connected to said output of said rectangular wave converter and an end of said coupling capacitor remote from said switch means, a fourth switch which is connected between said output of said second synchronous detector circuit and a control input of said first switch and which is turned on and off by said noise detecting means in synchronism with said switch means, and a capacitor connected between ground and said control input of said first switch.

5. The circuit of claim 4, wherein said holding means includes a buffer amplifier of unity gain having an input connected to said first switch and having an output, a signal absorbing resistor having a first end connected to said output of said buffer amplifier and having a second end, and a holding capacitor having a first end connected to said second end of said resistor and having a second end connected to said output of said switch means.

* * * * *